United States Patent
Tran et al.

(10) Patent No.: US 7,476,606 B2
(45) Date of Patent: Jan. 13, 2009

(54) EUTECTIC BONDING OF ULTRATHIN SEMICONDUCTORS

(75) Inventors: Dean Tran, Westminster, CA (US); Alan Hirschberg, Thousand Oak, CA (US); Ha K. DeMarco, Redondo Beach, CA (US); Luis Rochin, Temecula, CA (US); Thomas Chung, Redondo Beach, CA (US); Mark Kintis, Manhattan Beach, CA (US); Steven J. Mass, La Palma, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 168 days.

(21) Appl. No.: 11/390,772

(22) Filed: Mar. 28, 2006

(65) Prior Publication Data

US 2007/0235744 A1 Oct. 11, 2007

(51) Int. Cl.
*H01L 21/00* (2006.01)
*H01L 21/28* (2006.01)
(52) U.S. Cl. .................. 438/605; 438/25; 438/604
(58) Field of Classification Search ............ 438/25, 438/604, 605
See application file for complete search history.

(56) References Cited

U.S. PATENT DOCUMENTS

| | | | | |
|---|---|---|---|---|
| 3,179,542 A | * | 4/1965 | McCuster et al. | 438/540 |
| 6,611,002 B2 | * | 8/2003 | Weeks et al. | 257/94 |
| 7,022,550 B2 | * | 4/2006 | Venugopalan | 438/108 |
| 7,179,727 B2 | * | 2/2007 | Capewell et al. | 438/490 |
| 2002/0020836 A1 | * | 2/2002 | Kikuchi et al. | 257/1 |

FOREIGN PATENT DOCUMENTS

DE 38223347 * 1/1990

* cited by examiner

*Primary Examiner*—N Drew Richards
*Assistant Examiner*—Grant S Withers
(74) *Attorney, Agent, or Firm*—Patti, Hewitt & Arezina LLC

(57) ABSTRACT

Ultra-high speed semiconductors that are usually very thin and therefore very fragile still require connection to a circuit board and a heat transfer pathway. Ultra-high speed circuits and semiconductor devices are provided with a carrier plate formed on the backside of a wafer or substrate by a variety of deposition methods. The carrier plate is a series of metal layers, each being selected to enable the attachment of a relatively thick copper carrier plate to the backside of the substrate or wafer.

8 Claims, 2 Drawing Sheets

EUTECTIC BONDING OF ULTRATHIN SEMICONDUCTORS

TECHNICAL FIELD OF THE INVENTION

This invention relates to semiconductors and semiconductor processing. More particularly, this invention relates to a method of bonding a carrier to the backside of ultra-thin semiconductor wafers and devices.

BACKGROUND OF THE INVENTION

Semiconductor devices made from gallium arsenide (GaAs), indium phosphide (InP), and gallium nitride (GaN) are considered to be high speed or ultra high-speed devices. The substrates for these devices need to be kept thin and as a result, they are fragile and easily cracked. Notwithstanding their fragility, they still need a carrier by which they can be mounted to a circuit board or other planar surface through which power and information-bearing signals can be coupled into and out of them.

A recent development in semiconductor processing of high and ultra-high speed devices has been to attach a semiconductor substrate directly to a circuit board using conductive epoxy or solder. A problem with such prior art attachment methods includes defects in the connection adhesive, such as voids, oxidation or sloping. A method and a carrier structure by which a delicate, ultra-thin high-speed semiconductor devices can be attached to a substrate would be an improvement over the prior art.

SUMMARY

Ultra-high speed semiconductors can be directly applied to a circuit board or other substrate using a backside metallization layer or carrier that is grown or deposited onto the backside of an ultra-high speed electronic device. The backside metallization applied to the wafer allows individual chips or cut from the wafer to be attached to a circuit or package housing by hot-gas injection, hot plate or solder reflow, without using prior art conductive epoxy or solder perform and without sustaining physical damage.

The method of applying backside metallization is to apply an infrared alignment photolithography followed in sequence by a titanium adhesive layer. Platinum and gold protective layers follow the titanium and lift off the photoresist. An interconducting layer of aluminum is deposited over entire back side wafer surface follows photoresist lift-off process.

A conventional photolithography is applied over the aluminum layer and the aluminum layer is etched away so as to remove aluminum from beneath where devices 12 (electronic circuit or die) will be located on the wafer and to leave only the aluminum between the devices to act as interconducting path for next processing step. A relatively thick copper carrier layer is applied over the etched aluminum layer area (on backside devices) followed by a layer of solder SnAg, or SnAu or SnAuCu. After the copper and, solder layers are applied, the wafer can be cut into individual electronic devices, circuits or die.

DESCRIPTION

Figure 1:
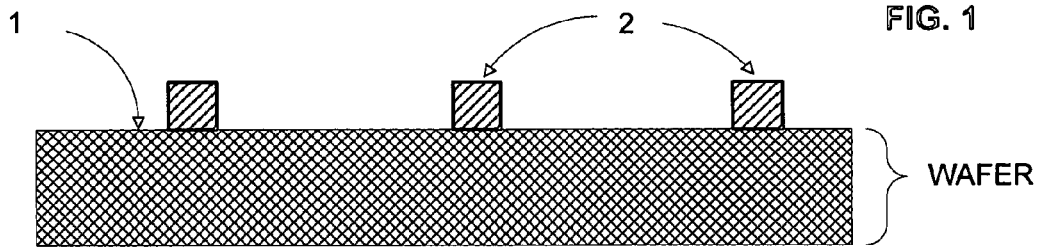
FIGS. 1-6 depict in cross section, layers of materials applied to the backside of a GaAs, InP or GaN wafer, which form a substrate or plate and they display the method steps of applying a carrier layer to the backside of the substrate or wafer.

FIG. 1 shows the backside surface (1) of an integrated circuit wafer in cross section. The semiconductor material from which the wafer is made is selected from groups IV or II-IV or III-V of the periodic table and for ultra-high speed semiconductors will have thicknesses less than or equal to 10 mils.

As used herein, the term "wafer" means a relatively large disk or plate in which several electronic circuits, components or photonics devices are formed at the same time during the various steps of forming a semiconductor device. Inasmuch as a wafer is made of semiconductor material, a wafer is also considered herein to be a "substrate" in which one or more electronic circuits, components or photonic devices are formed using semiconductor device fabrication techniques.

Various processes for forming semiconductors and semiconductor wafers are well known in the art but such processes are not germane to the invention described and claimed herein other than to note that back-side metallization and the process for applying backside metallization described herein is particularly applicable to thin semiconductor wafers. The method and apparatus disclosed and claimed herein actually finds application with virtually all semiconductors, including those formed from germanium (Ge), silicon (Si), cadmium telluride (CdTe), gallium arsenide (GaAs), indium phosphide (InP) and gallium arsenide (GaN).

Still referring to FIG. 1, after a wafer's thinning process is completed; a layer of photoresist (2) is applied to the backside (1) of the substrate/wafer using infrared alignment photolithography processes. Among other things, when the photoresist (PR) (2) is removed or lift-off, it identifies saw kerf lines where the wafer should be cut to separate electronic circuit components or photonics devices from the wafer so that they can be used individually. After the photoresist is applied, contact metal layers are applied to the backside (1) of the substrate/wafer which is actually comprised of a sequence of layers described as follows.

Figure 2:
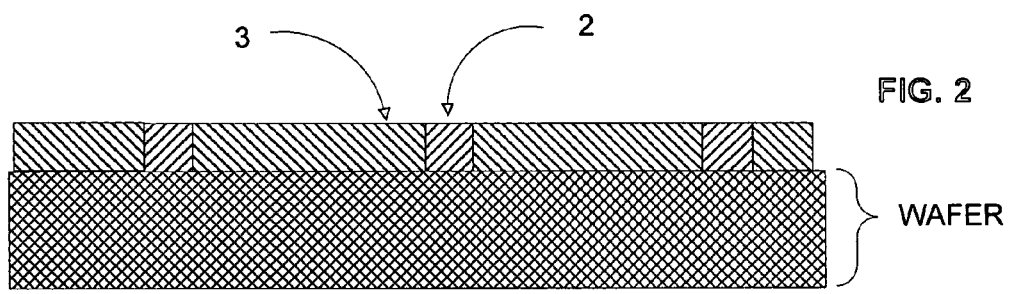

In FIG. 2, a series of contact metals (3) are deposited over the backside (1). A layer of titanium is deposited first because of its relatively superior ability to adhere to the semiconductor materials from which the wafer is formed. Because of its relatively superior adhesion to semiconductor material, the titanium layer is considered herein to be an adhesive layer.

Still referring to FIG. 2, a layer of platinum is deposited over the titanium, after which a protective layer of gold is deposited over the entire structure. Because gold may tend to leach into titanium, an intermediate platinum protective layer is applied to the titanium before the gold layer to prevent the gold from leaching into the titanium.

Figure 3:
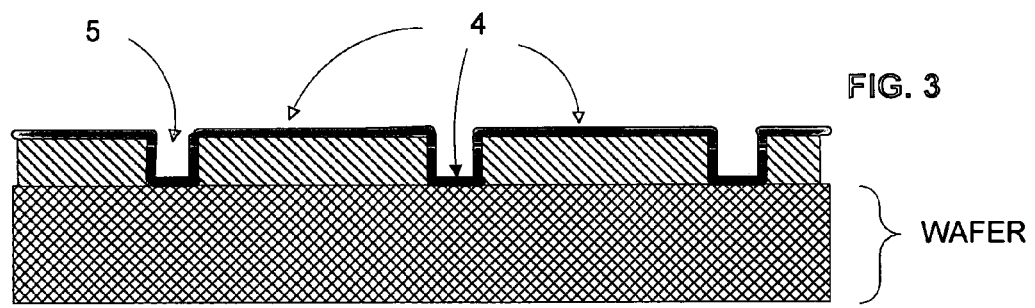

FIG. 3 shows that after the titanium, platinum and gold layers are deposited; the photoresist layer (2) is stripped or lifted-off away. FIG. 3 also shows that after the photoresist (2) is removed, the individual device is separated by the trench lines, an interconducting layer of aluminum (4) is deposited over the aforementioned gold layer but also into the trenches (5) formed when the photoresist (2) is removed. The trenches (5) will eventually become saw kerf guide lines.

Figure 3A:
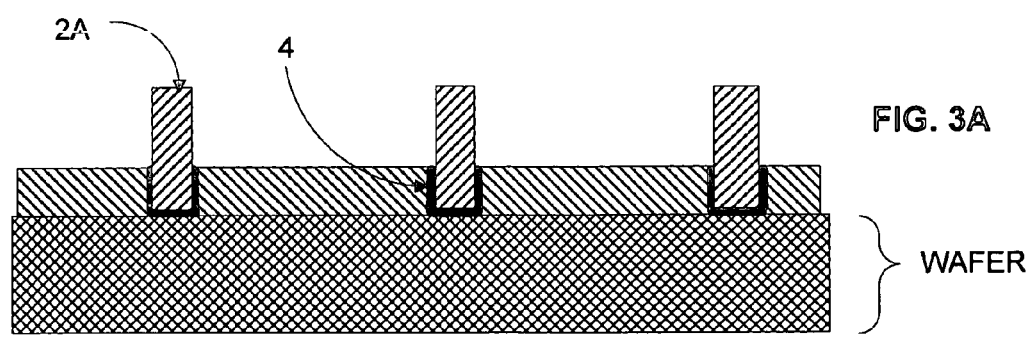
Figure 4:
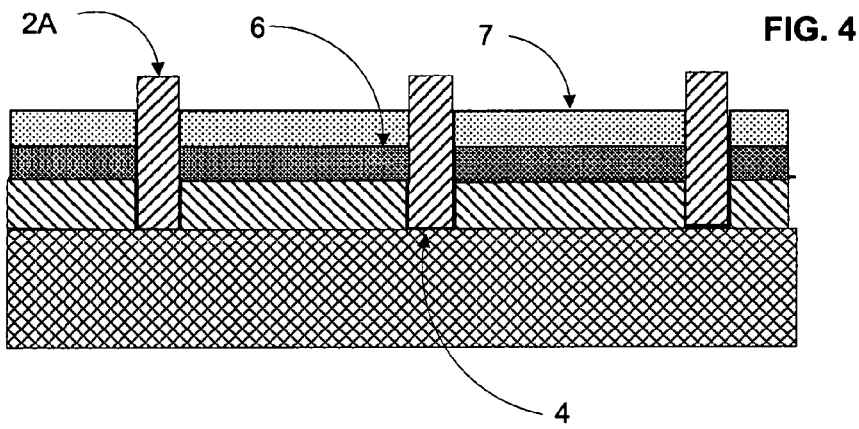

Turning now to FIG. 3A and FIG. 4, a conventional photolithography is applied following an aluminum interconducting layer deposition. The aluminum layer on backside of devices is etched away by photoresist developer. The aluminum layer under the trenches is protected by photoresist (2A) and to act as interconducting layer to electrically connect all individual devices for next processing step. A binding layer of nickel (6) is locally deposited over the gold layer (gold layer exposed after aluminum layer is etched away) and acts as a flashing plate.

FIG. 4 also shows the carrier layer (7). In one embodiment, the carrier layer (7) is relatively thick copper, deposited over the aforementioned nickel layer (6). The copper layer (7) is preferably between 0.5 to 5 mils of non-stress pure copper that is plated onto contact areas although thicknesses of up to 20 mils are also usable.

Copper is a good electrical conductor. It is also a good heat conductor. By making the carrier layer (7) thick and making it of pure copper, it provides a layer that will support the semiconductor and resist cracking and other damage that can be happen during handling.

Figure 5:
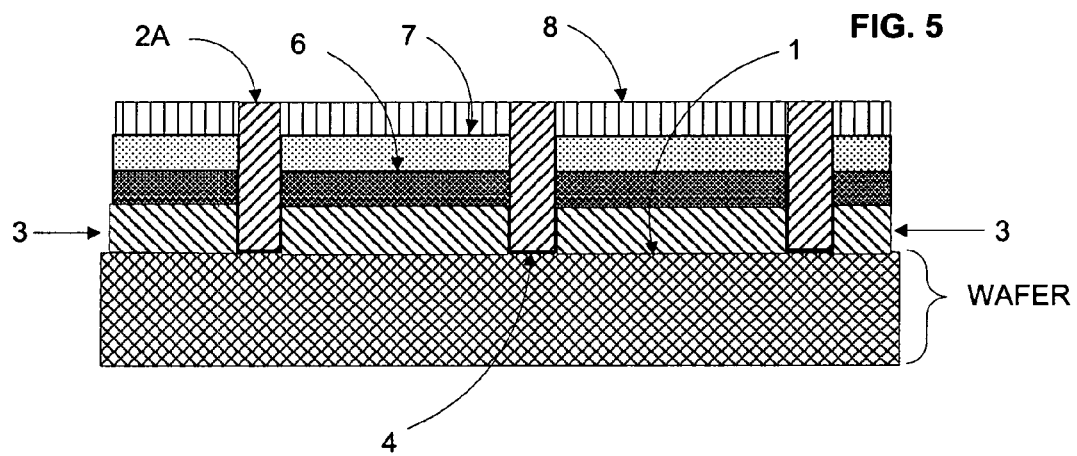
Figure 6:
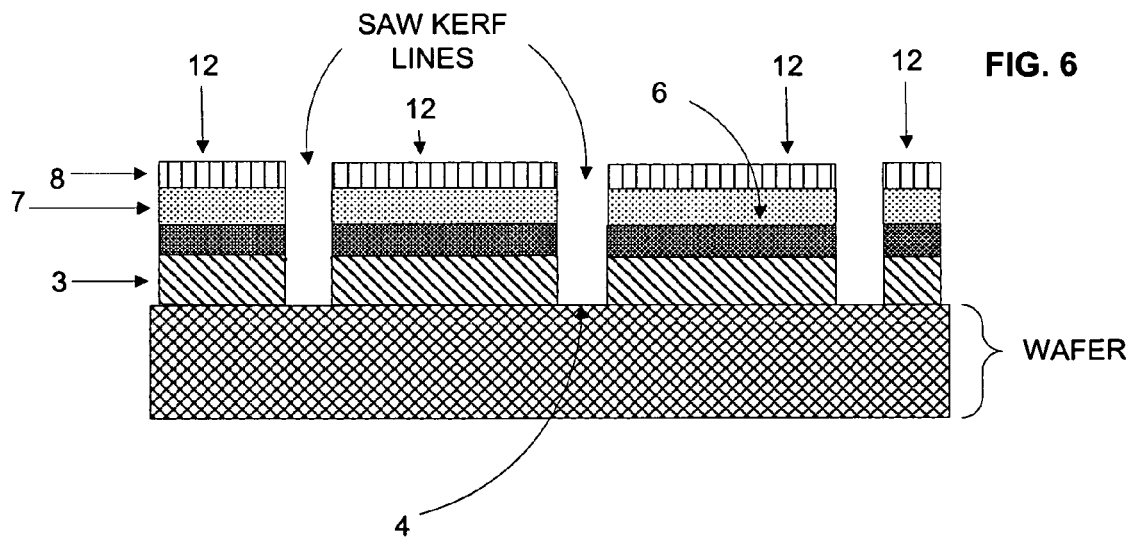

Referring now to FIG. 5, a thick solder plating layer (8) is deposited over the copper carrier layer (7). The plated solder layer (8) can include any one or more layers of tin/silver (SnAg) (96.5/3/5), tin/gold (SnAu) (20/80) or tin/silver/copper (SnAgCu) (96.5/3.0/0.5). In FIG. 6, the photoresist layer (2a) shown photolithographically deposited after FIG. 3A, is stripped away and again disclosed the saw kerf line to guide for cut or dice in the process of separating the wafer into single chips.

As stated above, the substrate/wafer thickness can be less than or equal to 10 mils.

In the method described above, the layers deposited on the back side of the wafer substrate as depicted in FIGS. 1-6 can be deposited by different methods. Known methods of depositing thin metal films include thermal evaporation, E-beam evaporating, sputtering, plating, or screen printing.

In the embodiment described above, the titanium adhesive layer has a thickness that is typically less than or equal to 500 Angstroms. Although thicker adhesive layers are certainly possible, the function of the adhesive layer is to provide a layer that itself adheres to semiconductor but which will allow other materials that do not adhere well to a semiconductor to be applied to it.

The intermetal layer combined of titanium, platinum and gold has a thickness that can vary from less than or equal to 500 Angstroms, to less than or equal to 1000 Angstroms. The interconducting aluminum layer is typically less than or equal to one thousand angstroms.

The nickel layer, which is considered herein to be a binding layer, has a thickness that is less than or equal to 10,000 Angstroms. As stated above, the copper carrier metal layer is relatively thick. It's thickness can range up to 20 mils.

Those of ordinary skill in the art will appreciate that the foregoing method and structure for eutectic bonding of a carrier to the backside of an ultra-high speed semiconductor wafer or substrate will enable such an integrated circuit device to be attached to a circuit board using known methods that include hot-gas injection, a hot plate or a solder reflow process. By applying the relatively thick copper carrier as described above, ultra-high speed integrated circuits that must be kept as thin as possible are less susceptible to cracking and other physical damage.

What is claimed is:

1. A method of forming a carrier on a semiconductor wafer having a plurality of separate semiconductor devices, a substantially planar back side and a thickness less than or equal to 10 mils, said method comprised of:
    a) applying a first photoresist layer to the back side;
    b) depositing a first contact layer on said back side that is comprised of:
    an adhesive titanium layer, followed by an intermediate layer of platinum over the titanium layer, followed by a layer of gold over the platinum layer, the layers of titanium, platinum and gold being deposited onto the back side of the substrate;
    c) removing the first photoresist layer to form one or more trench lines;
    d) depositing an interconducting layer of aluminum grown on the gold layer of the first contact layer and within the one or more trench lines;
    e) applying a second photoresist layer to the layer of aluminum over the one or more trench lines;
    f) locally removing the aluminum layer from the gold layer between the second photoresist layer;
    g) depositing a binding layer of nickel over the gold layer between the second photoresist layer;
    h) depositing a carrier metal layer of copper on the nickel layer between the second photoresist layer;
    i) depositing a solder layer on the copper layer between the second photoresist layer; and
    j) removing the second photoresist layer.

2. The method of claim 1 wherein depositing is comprised of the steps of:
    e-beam evaporating, thermal evaporating, sputtering, plating or screen printing.

3. The method of claim 1 wherein said adhesion layer is deposited to have a thickness that is less than or equal to 500 Angstroms.

4. The method of claim 1 wherein said intermediate layer is deposited to have a thickness that is less than or equal to 500 Angstroms.

5. The method of claim 1 wherein said interconducting layer is deposited to have a thickness that is less than or equal to 1000 Angstroms.

6. The method of claim 1 wherein the binding layer is deposited to have a thickness that is less than or equal to 10,000 Angstroms.

7. The method of claim 1 wherein the carrier metal layer is deposited to have a thickness that is less than or equal to 10 mils.

8. The method of claim 1, wherein the step of applying the first photoresist layer to the back side comprises the step of:
    applying the first photoresist layer to identify one or more saw kerf lines that separate one or more electronic devices of the semiconductor wafer;
    the method further comprising the step of dicing said wafer along the one or more saw kerf lines into several separate substrates for the one or more electronic devices.

* * * * *